US010109546B2

(12) United States Patent
Soisson et al.

(10) Patent No.: US 10,109,546 B2
(45) Date of Patent: Oct. 23, 2018

(54) PROCESS OF ENCAPSULATING ELECTRONIC COMPONENTS

(71) Applicant: VALEO EQUIPEMENTS ELECTRIQUES MOTEUR, Creteil (FR)

(72) Inventors: Arnaud Soisson, Neuville-sur-Oise (FR); Philippe Banet, Acheres (FR); Linda Chikh, Maisons-Laffitte (FR); Odile Fichet, Poissy (FR)

(73) Assignee: Valeo Equipements Electriques Moteur, Creteil (FR)

( * ) Notice: Subject to any disclaimer, the term of this patent is extended or adjusted under 35 U.S.C. 154(b) by 17 days.

(21) Appl. No.: 15/531,811

(22) PCT Filed: Dec. 1, 2015

(86) PCT No.: PCT/FR2015/053279
§ 371 (c)(1),
(2) Date: May 31, 2017

(87) PCT Pub. No.: WO2016/087767
PCT Pub. Date: Jun. 9, 2016

(65) Prior Publication Data
US 2017/0358509 A1   Dec. 14, 2017

(30) Foreign Application Priority Data

Dec. 4, 2014 (FR) ...................................... 14 61893

(51) Int. Cl.
*H01L 23/29*   (2006.01)

(52) U.S. Cl.
CPC .......... *H01L 23/296* (2013.01); *H01L 23/295* (2013.01); *H01L 2224/48137* (2013.01)

(58) Field of Classification Search
CPC ............................ H01L 23/295; H01L 23/296
See application file for complete search history.

(56) References Cited

U.S. PATENT DOCUMENTS

| 4,526,838 A | 7/1985 | Fujioka et al. | |
|---|---|---|---|
| 5,578,697 A * | 11/1996 | Kawamonzen | .... C08G 73/1025 257/E23.077 |
| 2011/0012252 A1* | 1/2011 | Gao | ...................... H01L 25/071 257/698 |
| 2014/0264959 A1* | 9/2014 | Okuhira | ................ H01L 23/293 257/788 |
| 2016/0102204 A1* | 4/2016 | Zhou | ...................... C08L 77/06 521/138 |

* cited by examiner

*Primary Examiner* — Whitney T Moore
*Assistant Examiner* — Joseph Galvin, III
(74) *Attorney, Agent, or Firm* — Berenato & White, LLC

(57) ABSTRACT

In order to carry out the encapsulation of electronic components, the invention proposes to cover the electronic components (7) with a heat-polymerisable material corresponding to a composition comprising a diimide constituent and a diamine constituent, in which the diimide constituent has been predissolved in the diamine constituent, and to heat the assembly obtained under conditions suitable for carrying out the curing of the material by an addition polymerization reaction between said diimide constituent and the diamine constituent. The invention finds an application in particular in the field of electronic power modules.

16 Claims, 1 Drawing Sheet

PROCESS OF ENCAPSULATING ELECTRONIC COMPONENTS

CROSS-REFERENCE TO RELATED APPLICATIONS AND CLAIM TO PRIORITY

This application is a national stage application of International Application No. PCT/FR2015/053279 filed Dec. 1, 2015, which claims priority to French Patent Application No. 1461893 filed Dec. 4, 2014, the disclosures of which are incorporated herein by reference and to which priority is claimed.

FIELD OF THE INVENTION

The domain of the present invention is polymeric materials intended to be used under conditions such as those known for encapsulating electronic components.

This term is generally related to techniques which consist in protecting electronic components, by covering, enveloping or coating them with a suitable material, for long-term satisfactory performance under their conditions of use, whether an individual electronic component or, for more compelling reasons, a set of components incorporated in an electronic module, is concerned.

BACKGROUND OF THE INVENTION

With this intention, resort to polymeric materials is mandated due to their convenience of implementation, which entails the material being cured in-situ by polymerising the constituents of a previously applied monomer composition covering the products to be protected.

So that the quality of the materials obtained is suitable for encapsulating electronic components, they need to be resistant to extreme conditions of operation in terms of temperature and durability. The operating temperatures to be resisted, just as in the field of aerospace, are in the cryogenic temperature range or that of higher temperatures above 200° C., even capable of reaching 400° C.

Other qualitative requirements for these products relate to resistance to chemical agents, resistance to water or moisture and to thermal or electrical insulation capacity.

To meet these requirements the use of polymers in the polyimide class can be considered. These polymers are known for their mechanical and physico-chemical qualities in applications which however are very different from encapsulation which is the aim of the present invention. It is expedient here to refer to U.S. Pat. No. 4,526,838 and the prior art which is cited in this. The technique which is described there relates to polymers used as binder with fibrous fillers to produce composite materials.

Generally the synthesis of polyimides is carried out in solution. The presence of an aqueous base being prohibitive in the presence of electrical conductive elements of the electronic components, it is proposed in the context of this invention to carry out the curing of the polyimides in an organic solvent. On this subject, existing technical documentation describes the use of polar aprotic solvents as dissolving medium for a polymerisation reaction carried out in the presence of catalysts, which can be acid catalysts or also alkaline catalysts.

Resort to a solvent, even a non-aqueous one, as reaction medium already represents a disadvantage, especially considering the context of the application to encapsulate electronic components. In fact, the variety of electronic components which are incorporated in the same module and encapsulated assembly makes it difficult to select an organic solvent which is perfectly benign for all of them.

It is added that the traditional process of synthesising polyimides is based on a polycondensation reaction using an acid dianhydride and a diamine and that such a reaction releases water. The reaction is realised very gradually along a two stage increase in temperature curve, with a first stage of at least one day at room temperature and a second hot stage carried out at high temperature normally between 100 and 300° C., which lasts several hours. However, when this reaction takes place in the presence of electronic components as for the application of encapsulation, the water vapour released is very harmful. On the whole, such conditions are incompatible with the needs for mass-producing electronic modules manufactured on a large scale, such as those known particularly in the world of motor vehicle equipment.

SUMMARY OF THE INVENTION

This is why the present invention proposes resorting to a process of synthesising polyimides by an addition reaction between the starting constituents rather than by a condensation reaction, in order to avoid any release of water vapour or other release of a secondary product. It moreover proposes not resorting to an exogenic solvent for the reaction compounds so as to be suitable for the application of electronic component encapsulation. For this reason, the two reactants of the polyaddition reaction are selected such that one has two imide functions within the molecule and the other two amine functions, and at least one of which is liquid so that the diimide compound can be dissolved in the diamine compound before any polymerisation reaction between them.

The diimide selected in accordance with the invention is advantageously a dimaleimide, i.e. a compound comprising at least two maleimide groups at the ends. The chain which connects them can be of the aromatic or otherwise cyclic type, or of the aliphatic linear or branched type. However short and hindered chains will be preferred, such as chains consisting of benzene nuclei, including the benzene and its counterparts, having possibly adjoined nuclei, or aliphatic chains of low molecular weight, not counting more than five carbon atoms in line with the nitrogen atoms of the maleimide groups.

In typical examples of each of these various compounds, as particularly advantageous for implementing the invention, among the aromatic dimaleimides, it is expedient to cite compounds 1.3- or 1.4-di-(maleimido) benzene, or naphthalene 1.5-dimaleimide, or again bismaleimide, and among the aliphatic chain dimaleimides, more particularly 1.4 di-(maleimido) butane and tris-(2-maleimidoethyl) amine can be cited. All compounds cited here have the advantage of being easily accessible on the basis of products commercially available for industrial use.

The other compound necessary for the addition polymerisation reaction on ethylene double bonds of the maleimide groups is a reactive solvent of the diamine type which is selected depending on the solubilisation rate of the maleimide in diamine under conditions of dissolution at a temperature above the diamine melting point but lower than that which would cause an addition reaction with the maleimide to start. In practice, this reaction temperature ranges between 80° C. to 200° C., knowing that it is preferable this temperature does not exceed approximately 200° C. and that it only needs a relatively short time, typically under one hour.

The proportions between the two constituents are selected in a manner, traditional in itself, depending on the stoichiometry of the polyaddition reactions to be implemented.

FIGS. 1 to 3 appended illustrate the implementation of a process of encapsulation according to the invention in the context of producing power modules having electronic components, such as those which are combined with transistors, for example of the MOSFET type, to form a rectifier bridge or inverter, as can be found in motor vehicle alternator-starters.

DETAILED DESCRIPTION OF THE PREFERRED EMBODIMENT(S)

Figure 1:
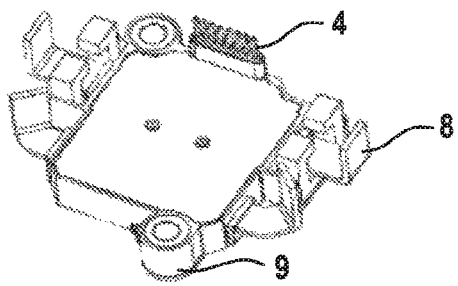
FIG. 1 shows a module enclosed in a housing as it comes out of the encapsulation plant and ready to be assembled in its connections with other elements of the same alternator-starter unit, whereas FIG. 2 more especially serves to illustrate the process of encapsulation itself, such as implemented for encapsulating the visible electronic components in the open housing of FIG. 3, together with the conducting circuits which are associated with these.
Figure 2:
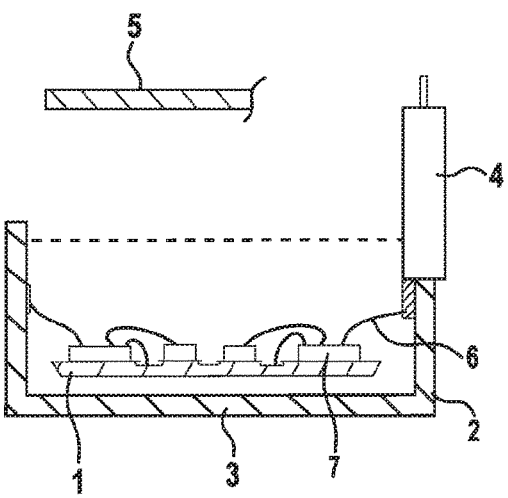
Figure 3:
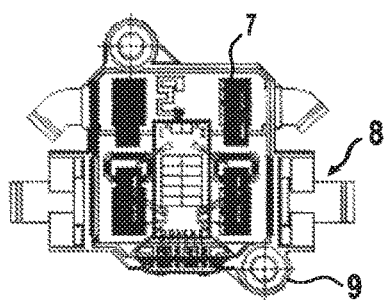

The components pre-assembled on plate 1 supporting printed connection circuits between components are disposed in a receiver housing 2 open at the top. The support plate rests on base 3. The connecting wires 6 have been welded to provide a connection between the components combined with transistors 7 and the printed circuits, as well as to set of connections 4 supported by the side wall of the housing on which other equipment will be connected. The figures also show electric power terminals 8, as well as wings 9 receiving bolts typically attaching the housing to a heat sink of the power electronics of the alternator-starter.

The mixture-pre-prepared to a liquid state, which is viscous to a greater or lesser extent by dissolving the diimide in diamine—is then poured into the housing in sufficient quantity so that all components there are immersed. Possibly a cover plate 5, which seals and protects the assembly, without however hampering set of connections 4, is then fixed on the housing completely filled with said composition. The curing of the material is then carried out by heat-polymerisation and cross-linking of the constituents of the starting mixture under the conditions which will be detailed in the following examples.

Example 1

3 grams of 2-methyl 1.5-diamino pentane and 7 grams of 1.4-di(maleimido) benzene, preferably at a temperature lower than 25° C., is gently mixed until a homogeneous mixture is obtained.

The paste, deposited on a substrate, is placed in an oven at 175° C. for at least 15 minutes.

The material finally obtained has a freezing fraction of approximately 90%, a mass moisture ingress under normal conditions of temperature and pressure of 5%, a degradation temperature at 5% mass loss of almost 300° C., a storage modulus of 2.7 GPa at 20° C., and a mechanical relaxation temperature of approximately 130° C.

A water drop deposited on the cured surface forms an angle of approximately 98 degrees, which proves its hydrophobic character.

Example 2

One starts by preparing the solvent by hot-mixing 1.84 grams of 4-aminophenyl sulfonic acid with 2.16 grams of 2-methyl-1.5-diaminopentane until a limpid yellowish solution is obtained. The solution is then allowed to cool.

3.5 grams of the above mixture and 6 grams of 1.4-di (maleimido) benzene are gently mixed, preferably at a temperature lower than 20° C., until a homogeneous paste is obtained.

This paste is not used for pouring into a housing as illustrated by the figures, but is applied as a solid gel to a set of components on their support plate, it being essential that they are completely covered.

The paste, deposited on a substrate, is placed in an oven at 175° C. for at least 15 minutes.

The material finally obtained has a freezing fraction of approximately 75%, a mass moisture ingress under normal conditions of temperature and pressure of 5%, a degradation temperature at 5% mass loss of 310° C., a storage modulus of 2.3 GPa at 20° C. and a mechanical relaxation temperature of approximately 180° C.

A water drop deposited on the cured surface forms an angle of approximately 105 degrees, which proves its hydrophobic character.

The introduction of an aromatic diamine enables the thermal degradation temperature to be increased. The mechanical relaxation temperature is also increased, which allows a stable Young's modulus to be reached over a wider range of temperatures.

Example 3

8.30 grams of α,ω-aminopropyl poly-dimethylsiloxane and 3.75 grams of 1.4-di (maleimido) benzene are vigorously mixed, working under high vacuum, until a homogeneous mixture is obtained.

The mixture can be used for pouring into a housing as illustrated by the figures, is deposited on a substrate as in example 1, then placed in an oven at 125° C. for at least 15 minutes.

The material obtained contains a freezing fraction of approximately 60%, zero moisture ingress under normal conditions of temperature and pressure, a degradation temperature at 5% mass loss of 340° C., a storage modulus of 0.025 GPa at 20° C. and the mechanical relaxation temperatures detected of approximately −105° C. and 50° C.

A water drop deposited on the surface forms an angle of approximately 100 degrees, which proves its hydrophobic character.

The use of a diamine containing silicone in this example enables the thermal degradation temperature to be increased and the moisture ingress to be decreased (more hydrophobic material). The material obtained also has a storage modulus 100 times lower, which decreases the stresses on the electronic components. In addition, the mechanical relaxation temperature is also decreased.

From the above examples it is evident that the polymeric compositions to be used for encapsulating electronic components according to the invention will be implemented, for each case of application, in several different ways, which will vary in particular according to the viscosity of the mixture of diimide dissolved in diamine. This viscosity can in fact be that of a liquid applied by pouring into a housing acting as a mould, or rather that of a gel applied as paste without needing a mould. The electronic components, including their wiring, are completely immersed in the fluid material, so that they are covered in the solid mass obtained after heat-curing of the starting composition, the constituents of which are thus polymerised with cross-linking.

From the same examples, it is also evident that in all cases the mechanical and physico-chemical characteristics of the material finally obtained after curing of the initial composition correspond to the specifications usually required depending on the conditions of operation and use of electronic power modules. The material is homogeneous, the free surface is smooth and hydrophobic, insensitive to environmental attacks encountered in motor vehicle applications.

It still appears from these examples that if a simple aliphatic diamine such as 2-methyl 1.5-diamino pentane can be perfectly used as suitable reactive solvent for diimide, it may be more advantageous to prefer over this a diamine constituent containing an aliphatic diamine supplemented by an aromatic diamine compound as in example 2 or by a diamine compound carrier in addition to a functional group other than the silicone diamine of example 3. In each case the diimide is dissolved in diamine at normal temperature (i.e., between 20° C. and 25° C.) and the curing temperature used ranging between 80° C. and 200° C. remains. A reaction time of about 15 to 30 minutes at this temperature appears sufficient, which generally confirms the feasibility of under one hour.

It will also be noted that although the description more particularly details the case where the diimide constituent is a dimaleimide, the invention also includes the generalisation to other structures such as maleimide, nadimide and allyl-nadimide.

The invention claimed is:

1. A process for encapsulating electronic components, comprising the steps of:
    dissolving a diimide constituent in a diamine constituent carried out at a normal temperature ranging between 20° C. and 25° C.;
    placing the electronic components together with associated connection circuits in a housing;
    encapsulating the electronic components in a heat-polymerisable material corresponding to a composition comprising the diimide constituent pre-dissolved in the diamine constituent by filling the housing with the electronic components being previously placed in the housing together with the associated connection circuits with the heat-polymerisable material in the liquid state, and
    heating the heat-polymerisable material encapsulating the electronic components under conditions suitable for carrying out the curing of the heat-polymerisable material by an addition polymerisation reaction between the diimide constituent and the diamine constituent.

2. The process according to claim 1, wherein the curing of the material is carried out at a temperature ranging between 80° C. and 200° C.

3. The process according to claim 2, wherein the curing duration is under one hour.

4. The process according to claim 1, wherein the diimide constituent is a dimaleimide, maleimide, nadimide or allyl-nadimide.

5. The process according to claim 4, wherein the diimide constituent is a composition comprising at least two maleimide groups at the ends of an aromatic chain.

6. The process according to claim 4, wherein the diimide constituent is a composition comprising at least two maleimide groups at the ends of an aliphatic chain of low molecular weight.

7. The process according to claim 1, wherein the diamine constituent is based on an aliphatic diamine, supplemented by an aromatic diamine or a silicone diamine.

8. The process according to claim 1, applied to encapsulate electronic components in a power module housing.

9. The process according to claim 2, wherein the diimide constituent is a dimaleimide, maleimide, nadimide or allyl-nadimide.

10. The process according to claim 3, wherein the diimide constituent is a dimaleimide, maleimide, nadimide or allyl-nadimide.

11. The process according to claim 2, wherein the diamine constituent is based on an aliphatic diamine, supplemented by an aromatic diamine or a silicone diamine.

12. The process according to claim 3, wherein the diamine constituent is based on an aliphatic diamine, supplemented by an aromatic diamine or a silicone diamine.

13. The process according to claim 4, wherein the diamine constituent is based on an aliphatic diamine, supplemented by an aromatic diamine or a silicone diamine.

14. The process according to claim 5, wherein the diamine constituent is based on an aliphatic diamine, supplemented by an aromatic diamine or a silicone diamine.

15. The process according to claim 6, wherein the diamine constituent is based on an aliphatic diamine, supplemented by an aromatic diamine or a silicone diamine.

16. An encapsulated electronic component according to the process of claim 1.

\* \* \* \* \*